United States Patent
Church et al.

(10) Patent No.: US 12,052,828 B2
(45) Date of Patent: Jul. 30, 2024

(54) DISPENSING PATTERNS INCLUDING LINES AND DOTS AT HIGH SPEEDS

(75) Inventors: Kenneth H. Church, Orlando, FL (US); Patrick A. Clark, Orlando, FL (US); Xudong Chen, Orlando, FL (US); Michael W. Owens, Orlando, FL (US); Kelly M. Stone, St. Petersburg, FL (US)

(73) Assignee: NSCRYPT, INC., Orlando, FL (US)

( * ) Notice: Subject to any disclaimer, the term of this patent is extended or adjusted under 35 U.S.C. 154(b) by 855 days.

(21) Appl. No.: 12/552,448

(22) Filed: Sep. 2, 2009

(65) Prior Publication Data

US 2010/0055299 A1 Mar. 4, 2010

Related U.S. Application Data

(60) Provisional application No. 61/093,645, filed on Sep. 2, 2008.

(51) Int. Cl.
*H05K 3/12* (2006.01)
*H01L 21/67* (2006.01)

(52) U.S. Cl.
CPC ..... *H05K 3/1241* (2013.01); *H01L 21/67126* (2013.01); *H01L 21/6715* (2013.01); *H05K 2203/0126* (2013.01)

(58) Field of Classification Search
None
See application file for complete search history.

(56) References Cited

U.S. PATENT DOCUMENTS

| | | | | |
|---|---|---|---|---|
| 3,656,330 A | * | 4/1972 | Brown | B05B 13/0207 72/12.7 |
| 4,415,116 A | * | 11/1983 | Norton | B23K 3/02 219/230 |
| 4,485,387 A | * | 11/1984 | Drumheller | 346/140.1 |
| 4,656,048 A | | 4/1987 | Kudoh et al. | |
| 4,953,759 A | | 9/1990 | Breault et al. | |

(Continued)

FOREIGN PATENT DOCUMENTS

DE 19815005 A1 * 10/1999 ............ B29C 41/36
JP H0396399 A * 4/1991

OTHER PUBLICATIONS

Supplemental European Search Report, PCT/US2009/0055699, dated Dec. 19, 2011 (8 pages).

(Continued)

*Primary Examiner* — Nathan H Empie
(74) *Attorney, Agent, or Firm* — Goodhue, Coleman & Owens, P.C.

(57) ABSTRACT

A method for depositing a material on a substrate includes providing an apparatus with at least one material dispenser. The method further includes positioning the pen tip at a predetermined writing gap where the predetermined writing gap is a distance of more than 75 micrometers above the substrate. The method also provides for controlling velocity of the flow of material through the outlet and dispense speed based on dispensed line height and dispensed line width parameters. An apparatus for depositing a material on a substrate is also provided which may have one or more mechanical vibrators, a pen tip with a hydrophobic surface, or multiple nozzles and pen tips on a single pump.

15 Claims, 11 Drawing Sheets

(56) References Cited

U.S. PATENT DOCUMENTS

| | | | |
|---|---|---|---|
| 5,151,377 A * | 9/1992 | Hanoka | H05K 3/1241 |
| | | | 438/674 |
| 5,369,568 A * | 11/1994 | Song | G05B 19/253 |
| | | | 318/568.15 |
| 5,409,733 A | 4/1995 | Boger et al. | |
| 5,423,935 A | 6/1995 | Benecke et al. | |
| 5,533,675 A | 7/1996 | Benecke et al. | |
| 5,683,036 A | 11/1997 | Benecke et al. | |
| 5,720,820 A | 2/1998 | Boger et al. | |
| 6,234,379 B1 | 5/2001 | Donges | |
| 6,253,957 B1 | 7/2001 | Messerly et al. | |
| 6,255,142 B1 | 7/2001 | Babiarz et al. | |
| 6,264,090 B1 | 7/2001 | Muntz et al. | |
| 6,276,589 B1 | 8/2001 | Watts, Jr. et al. | |
| 6,338,981 B1 | 1/2002 | Klocke et al. | |
| 6,352,423 B1 | 3/2002 | Babiarz et al. | |
| 6,589,601 B1 | 7/2003 | Shimada | |
| 6,866,881 B2 | 3/2005 | Prentice et al. | |
| 6,913,183 B2 | 7/2005 | Becker et al. | |
| 6,986,739 B2 | 1/2006 | Warren et al. | |
| 7,404,861 B2 | 7/2008 | Prentice et al. | |
| 2002/0084290 A1 | 7/2002 | Materna | |
| 2002/0159919 A1* | 10/2002 | Churchill et al. | 422/100 |
| 2003/0029336 A1 | 2/2003 | Thompson et al. | |
| 2003/0100824 A1* | 5/2003 | Warren et al. | 600/407 |
| 2003/0111011 A1* | 6/2003 | Gibson et al. | 118/410 |
| 2003/0207464 A1* | 11/2003 | Lemmo et al. | 436/180 |
| 2003/0209575 A1* | 11/2003 | Bremner et al. | 222/566 |
| 2004/0118935 A1* | 6/2004 | Holm | B23K 3/0607 |
| | | | 239/589 |
| 2004/0214370 A1 | 10/2004 | Quinones et al. | |
| 2005/0013926 A1* | 1/2005 | Rutkowski et al. | 427/8 |
| 2005/0082670 A1 | 4/2005 | Quinones et al. | |
| 2005/0095365 A1 | 5/2005 | Acum et al. | |
| 2005/0252908 A1* | 11/2005 | Weiss | H05B 3/84 |
| | | | 219/522 |
| 2006/0193969 A1* | 8/2006 | Prentice et al. | 427/8 |
| 2006/0292295 A1* | 12/2006 | Kwon | C11D 11/0047 |
| | | | 427/162 |
| 2007/0151966 A1* | 7/2007 | Schwenke | H05B 3/86 |
| | | | 219/203 |
| 2007/0175175 A1* | 8/2007 | Schwenke | B05C 5/0225 |
| | | | 52/745.19 |
| 2007/0187437 A1* | 8/2007 | Lord | 222/568 |
| 2008/0134966 A1 | 6/2008 | Luebbecke et al. | |
| 2008/0156904 A1 | 7/2008 | Pek | |

OTHER PUBLICATIONS

International Search Report, PCT/US2009/055699, Nscrypt, Inc., dated Oct. 22, 2009, 2 pages.

* cited by examiner

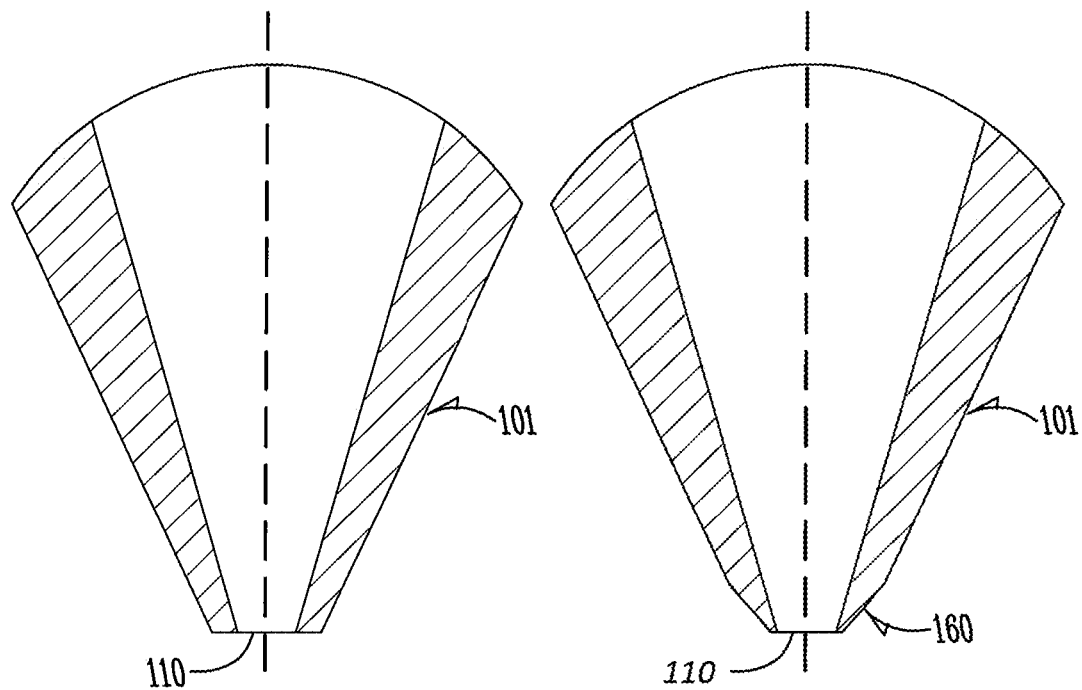

DISPENSING PATTERNS INCLUDING LINES AND DOTS AT HIGH SPEEDS

CROSS-REFERENCE TO RELATED APPLICATIONS

The present application claims priority to U.S. Provisional Patent Application No. 61/093,645 filed Sep. 2, 2008, herein incorporated by reference in its entirety.

FIELD OF THE INVENTION

The invention relates to the field of dispensing of materials, and more particularly, to methods and processes of dispensing various materials including high viscosity materials at high speeds.

BACKGROUND

Dispensing is a widely-used technology to apply bonding materials (e.g. adhesives, sealants and encapsulates) and functional materials (e.g. conductive, dielectric and resistive) in the electronics industry. One challenge of dispensing is to dispense a wide variety of materials on a wide range of substrates at production rate speeds. Production rate speeds are defined by standard screen printing methods.

Screen printing has been accepted as an industry standard in electronic device manufacturing for many years. The advantage is the low cost of the equipment and the large range of electronic materials that are screen printable. The disadvantages to screen printing are the material waste, the masking requirement, the contact with the substrate, the surface flatness requirement, the limitation in printed feature size and the limitation in profile or aspect ratio. Next generation electronic devices are smaller, not flat and fragile in the packaging process, therefore the advantages of a non-contact micro dispensing approach has serious advantages if high enough speeds of printing can be achieved with controlled thickness, width and line profile.

Pen tip dispensing is superior over jetting in producing continuous line patterns. Jetting, by means of merging adjacent droplets to form continuous lines, suffers from the continuity in the dispensed line width and height. Jetting also requires low viscosity materials of which reduce electrical characteristic performance. Pen tip dispensing lacks precise feature size control given a variable writing gap (the distance between the pen tip and the substrate). The dispensed material flow rate determines the line height as well as the line width, provided all others parameters are kept constant. In order to produce a dispensed line or pattern with uniform height, the writing gap must be precisely controlled.

Another challenge is to start and stop the dispensed line smoothly with the line height and width within tolerance of the desired application. The dispensed material will have an affinity for itself and the pen tip, therefore without wetting the substrate surface the start and stops will not be consistent.

What is needed is an improved method and system for dispensing liquid materials which addresses such problems.

SUMMARY

Therefore, it is a primary object, feature, or advantage of the present invention to improve over the state of the art.

It is a further object, feature, or advantage of the present invention to provide a method and system for dispensing liquid materials, including viscous materials which allows for precise placement above the surface and including conformal surfaces.

Another object, feature, or advantage of the present invention is to increase the travel velocity associated with dispensing.

Yet another object, feature, or advantage of the present invention is to provide for dispensing in a parallel manner with multiple pen tips in order to provide increased throughput.

A still further object, feature, or advantage of the present invention is to precisely control the writing gap.

A still further object, feature, or advantage of the present invention is to start and stop the dispensed line smoothly with the line height and width within tolerance of the desired application.

No single embodiment of the present invention need exhibit any or all of these objects, features, or advantages.

In accordance with the invention, a modified apparatus and a method for dispensing continuous lines and patterns with uniform line height and narrowed widths are provided. A new process for printing within a window of accepted gap from the dispense substrate will be described to enhance speed and reduce line width. A modification to the pen tip described in a previous patent to allow for decreased material pen tip interaction thus decreasing the line width is described. An addition of a hydrophobic surface on the pen tip to promote a clean start and stop without material clinging to the pen tip will be described. A mechanical vibrator on the pen tip to enhance the flow of more viscous particle loaded materials will be described. A change in the orifice of the pen tip from circular to square or rectangle to control the line width and line height and enhance the flow of more viscous particle loaded materials will be described. Multiple nozzles on a single pump may be used and such nozzles may be operated with parallel precision for increased throughput.

According to one aspect of the present invention, a method for depositing a material on a substrate is provided. The method includes providing an apparatus with at least one material dispenser comprising: (i) a tip orifice defining an opening and shape within a pen tip through which the material exits the dispenser, orientation of the tip with dispensing direction alters line width and height, (ii) at least one elongate feed channel having an inlet and a spaced outlet adjacent the tip orifice, the at least one feed channel having material therein and being sized and shaped so that the material therein may flow through the at least one channel from the inlet to the outlet, (iii) a valve for controlling the flow of material through the outlet of the at least one feed channel, the valve being moveable between an open position, in which material is permitted to flow through the outlet, and a closed position, in which material is not permitted to flow through the outlet, (iv) an actuator operatively coupled to the valve for selectively moving the valve between the open position and the closed position. The method further includes positioning the pen tip at a predetermined writing gap, the predetermined writing gap having a distance of more than 75 micrometers above the substrate. The method further provides for controlling velocity of the flow of material through the outlet and dispense speed based on dispensed line height and dispensed line width parameters.

According to another aspect of the present invention, an apparatus for depositing a material on a substrate is provided. The apparatus includes at least one material dispenser. The material dispenser may include (i) a tip orifice defining an opening and shape within a pen tip through which the material exits the dispenser, the direction of dispensing (ii) at least one elongate feed channel having an inlet and a spaced outlet adjacent the tip orifice, the at least one feed channel having material therein and being sized and shaped so that the material therein may flow through the at least one channel from the inlet to the outlet, (iii) a valve for controlling the flow of material through the outlet of the at least one feed channel, the valve being moveable between an open position, in which material is permitted to flow through the outlet, and a closed position, in which material is not permitted to flow through the outlet, (iv) an actuator operatively coupled to the valve for selectively moving the valve between the open position and the closed position, and (v) at least one mechanical vibrator is associated with the pen tip to induce mechanical vibrations of the pen tip. The pen tip of the apparatus may have a chamfer on an outside surface of the pen tip to reduce wall thickness. The pen tip may be coated to provide a hydrophobic surface.

According to another aspect of the present invention, a method for depositing a material on a substrate is provided. The method includes providing an apparatus with at least one material dispenser having (i) a tip orifice defining an opening within a pen tip through which the material exits the dispenser, (ii) at least one elongate feed channel having an inlet and a spaced outlet adjacent the tip orifice, the at least one feed channel having material therein and being sized and shaped so that the material therein may flow through the at least one channel from the inlet to the outlet, (iii) a valve for controlling the flow of material through the outlet of the at least one feed channel, the valve being moveable between an open position, in which material is permitted to flow through the outlet, and a closed position, in which material is not permitted to flow through the outlet, (iv) an actuator operatively coupled to the valve for selectively moving the valve between the open position and the closed position. The method further includes starting dispensement of material onto a surface of the substrate and raising the pen tip to a predetermined writing gap, the predetermined writing gap having a distance of more than 75 micrometers above the substrate. The method further includes controlling velocity of the flow of material through the outlet and dispenses speed based on dispensed line height and dispensed line width parameters and without further adjusting of a z-axis of the pen tip to compensate for variations in surface height.

BRIEF DESCRIPTION OF THE FIGURES

FIG. 3A is a schematic drawing of the needle tip in its original shape and FIG. 3B shows a modified shape.

DETAILED DESCRIPTION

The present invention is more particularly described in the following examples that are intended as illustrative only since numerous modifications and variations therein may be apparent to those skilled in the art. The various examples include methods and apparatus for dispensing various materials including high viscosity materials.

Dispensing is described in U.S. Pat. No. 6,986,739, issued Jan. 17, 2006 for "Architectural Tool and Method of Use," the contents of which are incorporated herein by reference in their entirety. U.S. Pat. No. 6,986,739 describes apparatus and methods for dispensing in various applications including in vitro and in vivo use in biological, tissue engineering, and medical processes. The present invention may also be used in such applications.

Figure 1:
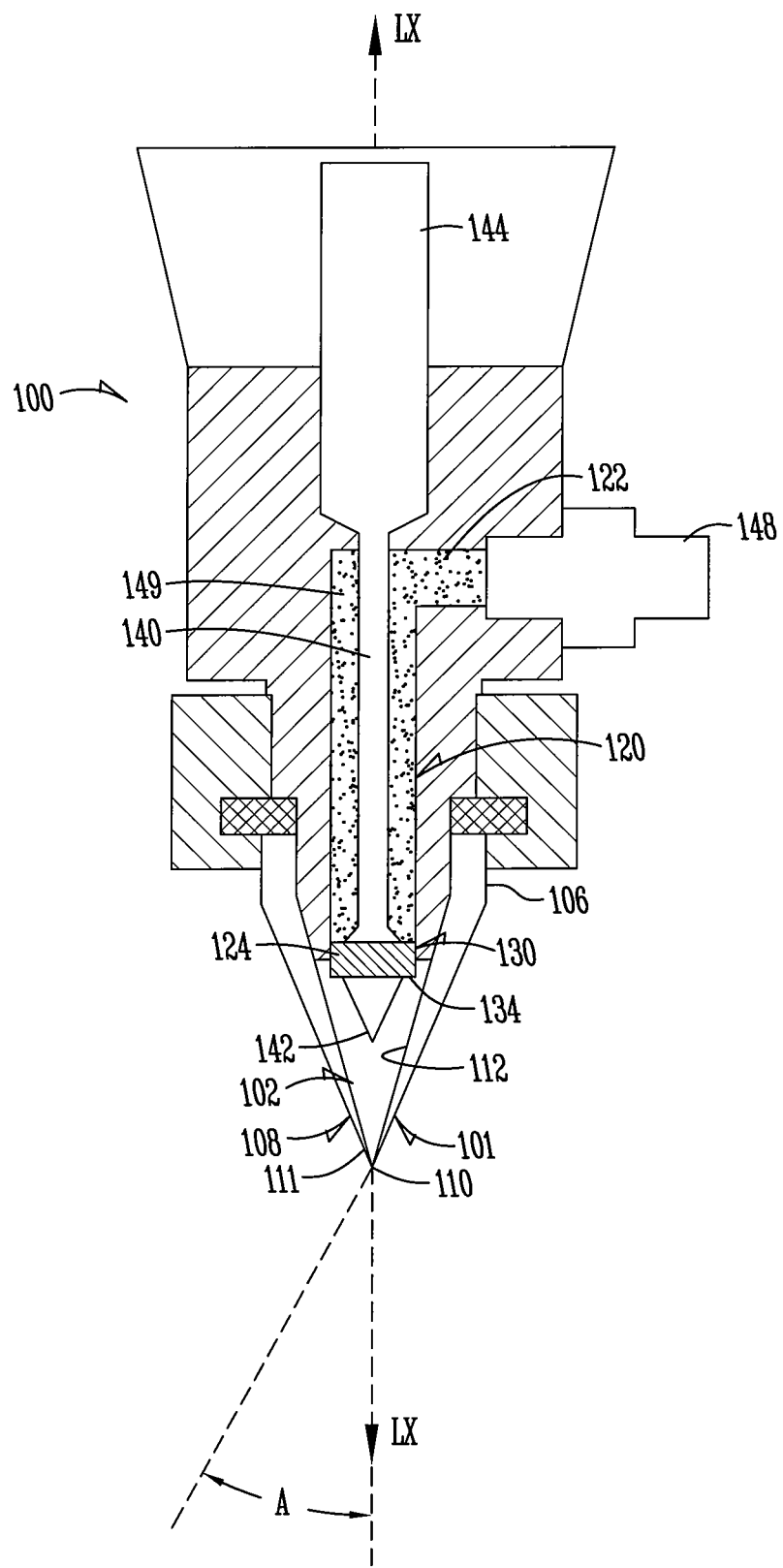
FIG. 1 is a sectional view of one embodiment of a material dispensing tool.

FIG. 1 illustrates one example of a material dispenser 100. The material dispenser 100 has at least one elongate feed channel 120 having an inlet 122 and a spaced outlet 124. The feed channel 120 may be sized and shaped to hold material to be deposited onto the substrate or target area, so that material stored in the feed channel 120 flows from the inlet to the outlet when the user wishes to deposit materials.

The material dispenser 100 has a pen tip 101. The material dispenser 100 also includes a tip chamber 102 having a proximal end defining a proximal orifice 106 therethrough. As will later be explained, the pen tip may have a coating 111. The tip chamber 102 has a spaced distal end 108 defining an opening, or tip orifice 110, through which material is dispensed onto the target area or substrate. The outlet 124 of the feed channel 120 is positioned adjacent the tip orifice 110. Thus, during material dispensing, the material flows through the feed channel 120 and the outlet 124, into the tip chamber 102, then out through the tip orifice 110 and onto the substrate or target area. Material flows through the tip chamber 102, then out through the tip chamber along a material flow path extending from the proximal end to the distal end, and generally alone a longitudinal axis LX through the tip chamber. As discussed in greater detail below, the tip chamber 102 has an inner surface 112 that, in some embodiments, is tapered from the proximal end 104 toward the distal end 108 such that the proximal orifice 106 is larger than the tip orifice 110. In some embodiments, that taper may be defined by angle A between the longitudinal axis LX and the inner surface 112. In some embodiments, the orifice 110 can be circular, square or rectangular.

The material dispenser 100 also includes a valve 130 for controlling the flow of material through the dispenser. The valve 130 has a valve tip 134 sized and shaped to substantially seal the tip orifice 110 against the flow of material therethrough. The valve 130 is generally moveable between an open position, in which material is permitted to flow through the outlet 124, and a closed position, in which material is not permitted to flow through the outlet 124. An actuator 144 such as a linear actuator with a piston 140 is operatively coupled to the valve 130 for selectively moving the valve between the open position and the closed position. A suck-back valve design may be used. A valve extension 142 may be placed between the valve 124 and the tip orifice 110 to assist in the movement of fluid during start up or shut down. A pump 148 powers a process a simple process of applying positive pressure to a material in a reservoir 149, and the flow of the material is controlled by adjusting the open position and closed position of the valve 130. Additional flow rates can be adjusted by reservoir pressure.

In some embodiments, the material dispenser 100 may include a conventional suction device for withdrawing material from the tip orifice 110 when the valve is in its closed position. Thus, in operation the material is displaced forward as the valve moves to the open position and the material is sucked back as the valve is moved to the closed position.

Increased Working Distance

Figure 2A:
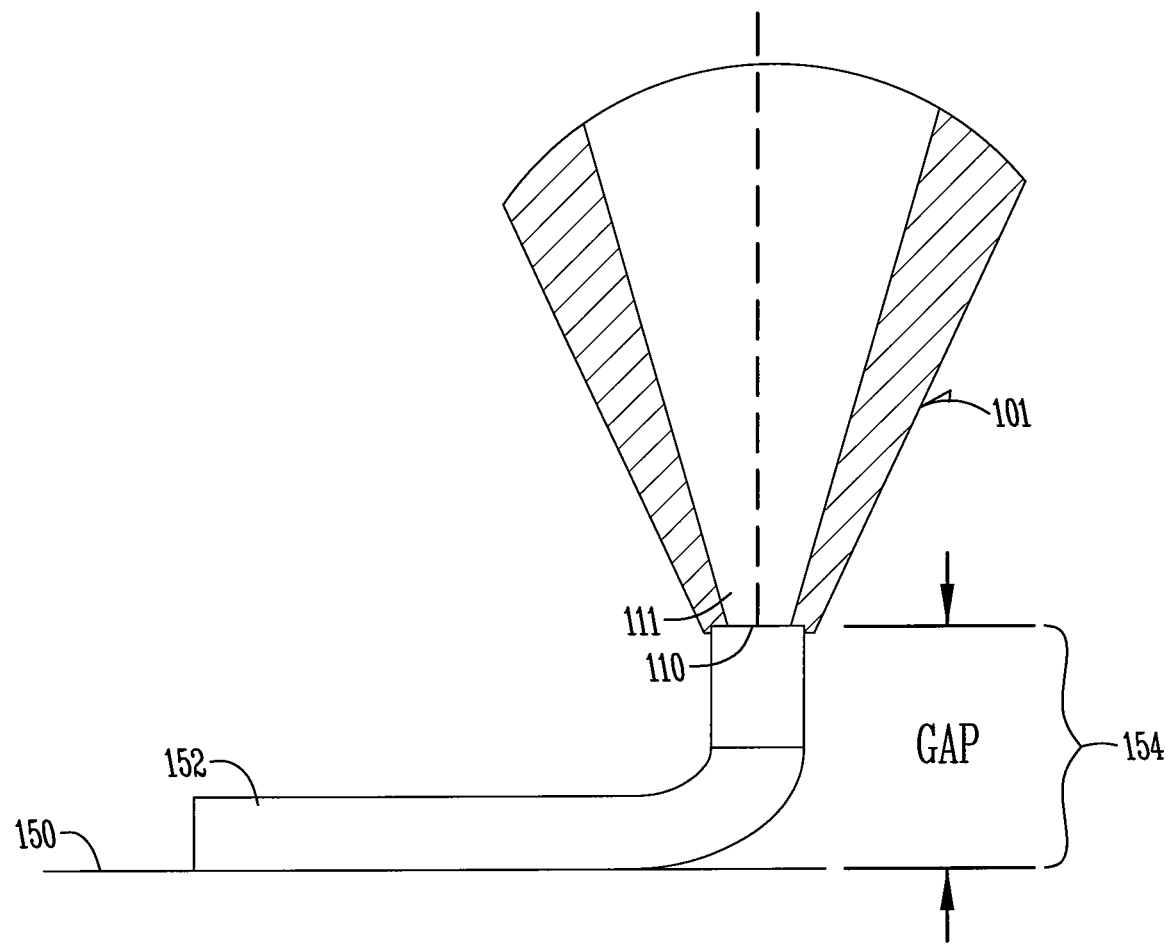
FIG. 2A is a drawing illustrating the gap size associated with the material dispensing tool.

According to one aspect of the present invention an increased working distance is used. It is standard in dispensing to place the pen tip close to the substrate, thus wetting the substrate and the pen tip simultaneously. While this is still a non-contact method of printing, it is still very close to the surface to be printed on. These close distances can range from a few micrometers to as much as, but typically less than, 75 micrometers (for small line widths of 300 micrometers and less). According to one aspect of the present invention, the pen tip is raised to more than 75 micrometers above the substrate depending on the substrate and the line widths required. FIG. 2A illustrates a pen tip 101 with the orifice 110 raised above the substrate 150 by the gap 154 while dispensing a line 152 or other dot or pattern. This increased distance requires an increase in velocity of the material flow from the pen tip. There are a number of ways to increase the velocity of the material flow; one such method is to increase the pressure. An increase in velocity of material flow explicitly equates to an increase in material flow and therefore more material on the substrate in a shorter period of time. This effect changes dispensed line height and dispensed line width. Control of this is done using an increase or decrease of speed. For narrow lines and increased material flow velocity, an increase in speed is required. Velocity of material flow and dispense speeds are used to control the line height and width. Another method to increase the height of a narrowed line width is to use a rectangular or oval tip and dispense with a high velocity and large gap. The narrow portion of the rectangular shape would be parallel to the lines being printed. It is possible to decrease the height or aspect ratio by printing a wider line that is thinner. This can be done by turning the rectangular pen tip by 90 degrees and aligning the wide portion of the rectangular shape and running parallel to the lines being printed. FIG. 2A illustrates a rectangular orifice with the standard tapered shape. This has the advantage of decreasing lines widths due to a reduced pressure given the larger area opening and can also increase or decrease the height of the dispensed lines depending on the orientation.

Having the pen tip above the substrate is advantageous in a number of ways. With the pen tip at least 75 microns above the substrate and usually 150 to 300 microns above the substrate and sometimes up to 1000 microns above the substrate, it is not necessary to scan slightly conformal or bumpy surfaces and continuously adjust the z-axis position of the pen tip. Thus, the pen tip is sufficiently above the substrate that the dispensing process is not affected by minor surface variations in the substrate.

It is to be understood that in the writing process, the process begins by dropping below the 75 micron mark to initiate the process by getting the dispensed material to wet or tack the start on the surface of the substrate. Then the pen tip is raised, preferably above 75 microns and less than 1000 microns and may be moved with high velocity. Note that the further above the surface the more the material seeks to spread out or whip around. The present inventors have found that under 1000 microns height allows for the benefits of having the pen tip above the surface to be achieved while still allowing well-controlled lines of materials to be dispensed. Where the surface of the substrate exhibits large changes in surface heights, surface scanning may be performed such as via laser or a camera and then position of the pen tip may be adjusted using a profile of the surface. Note that the precision of the z-axis tracking need not be as precise as in systems where the dispensing tool is maintained more closely to the surface. Thus, the increased working distance of the present invention is advantageous in removing complexity associated with the z-axis tracking and/or reducing the amount of precision required for z-axis tracking where used.

Figure 2B:
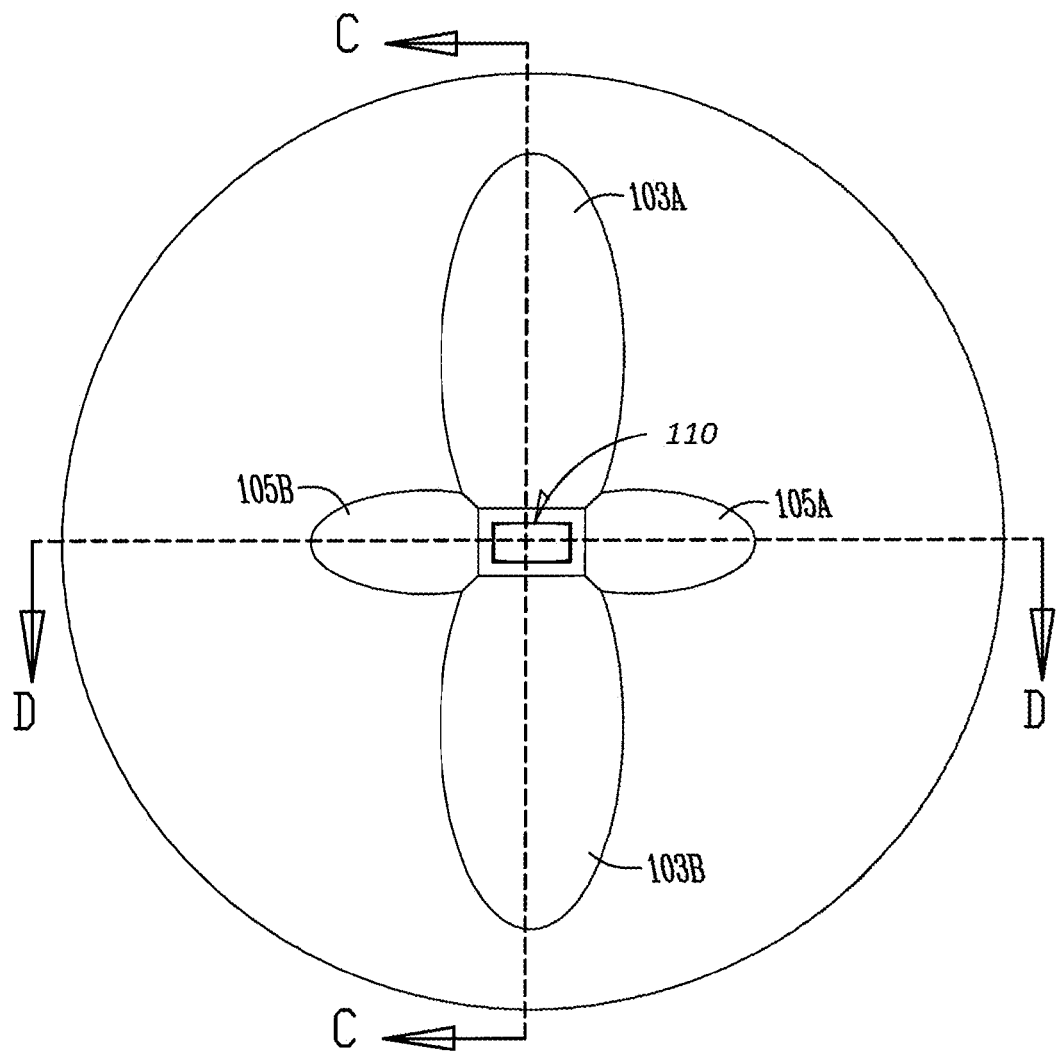
FIGS. 2B, 2C, and 2D illustrate a pen tip having a rectangular shaped orifice.
Figure 2C:
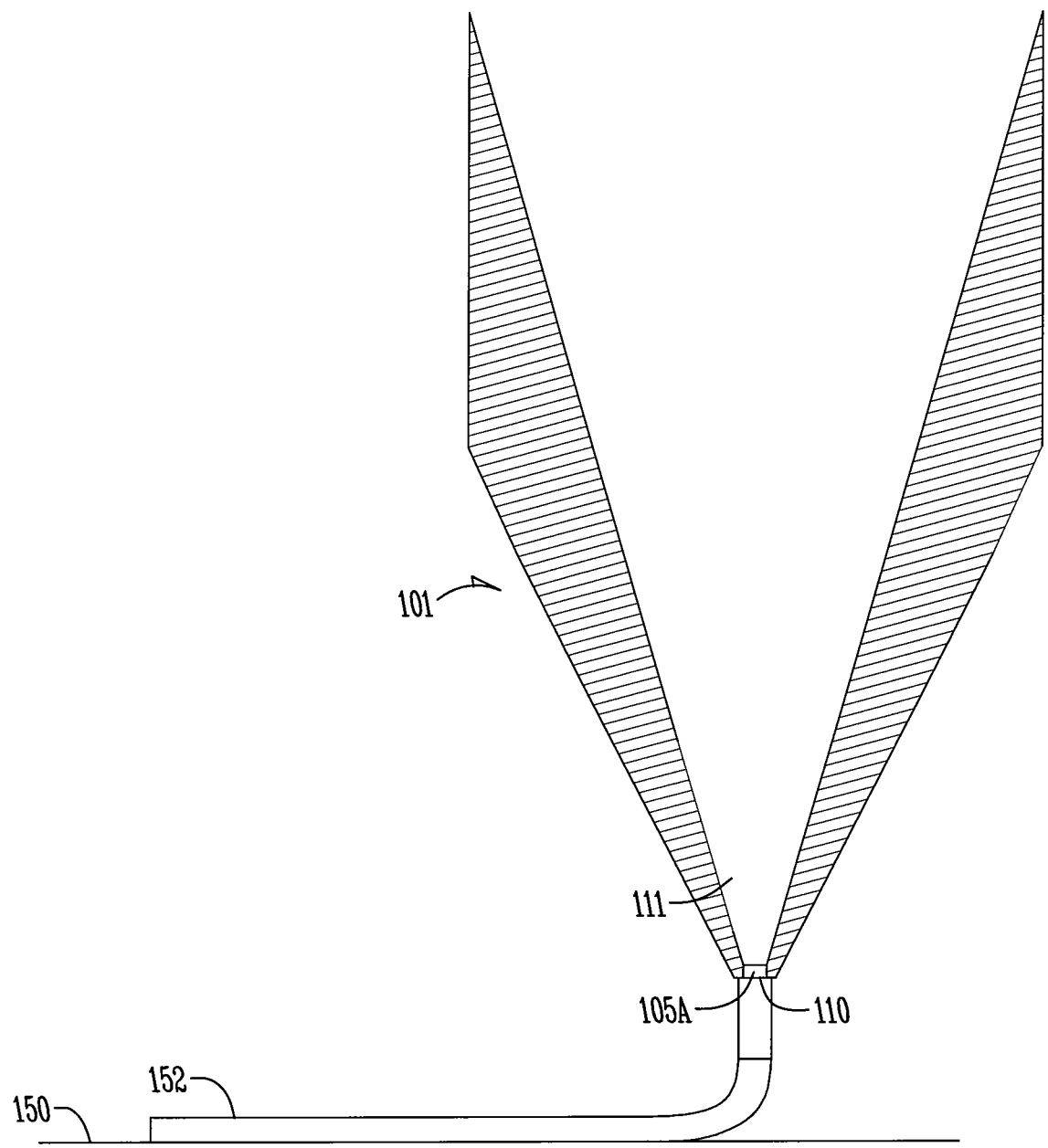
Figure 2D:
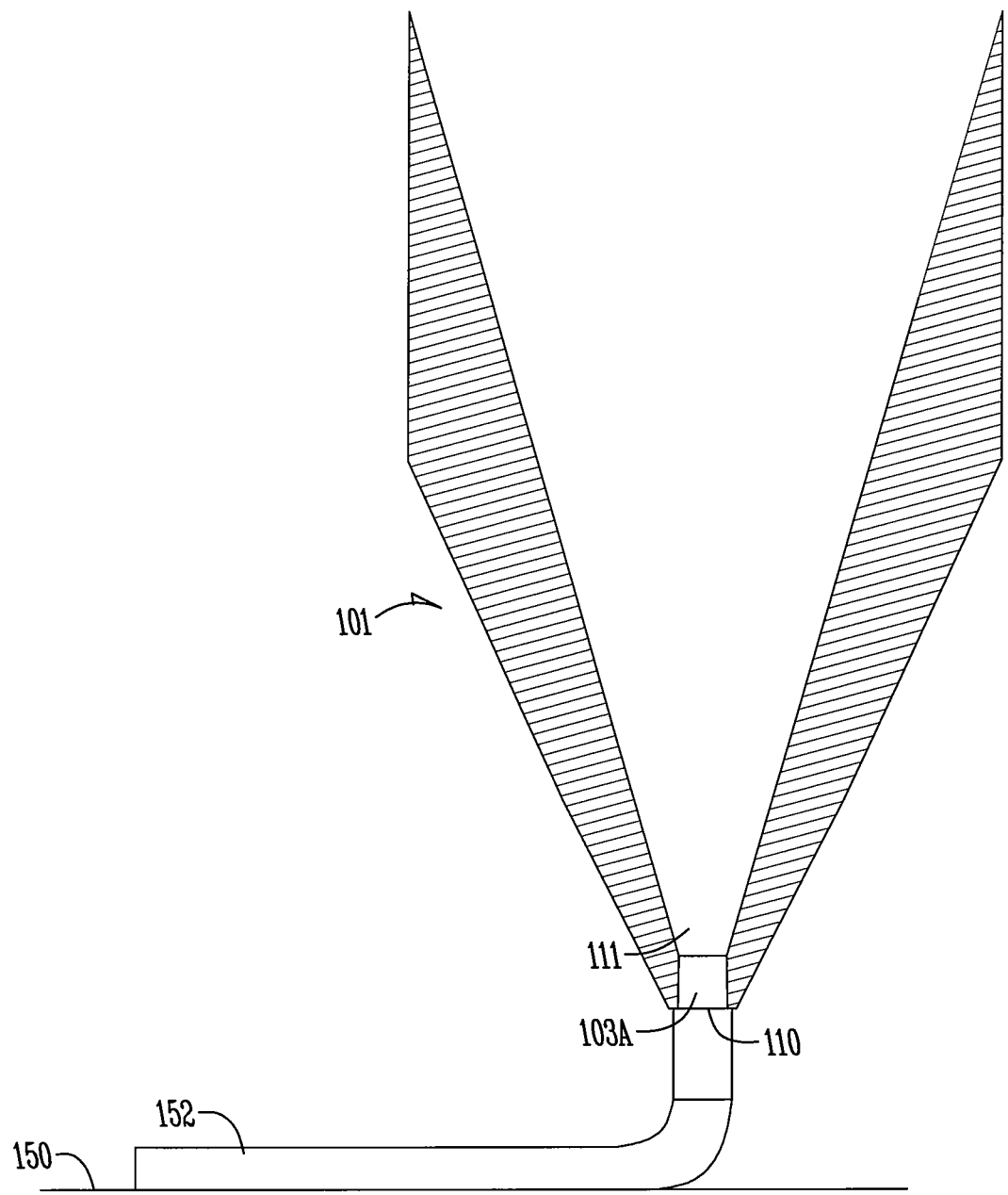

FIG. 2B illustrates one embodiment of the pen tip 101. As shown in FIG. 2B, the pen tip 101 has regions 103A, 103B, 105A, 105B with the pen tip 101 being rectangular in shape. Thus, the present invention contemplates differences in the geometry of the pen tip, allowing the pen tip to be circular, square, or rectangular.

Pen Tip Preparation

The pen tip may be specially prepared for high surface tension materials which are prone to adhere to the tip of the pen tip making wakes (or valleys) in the lines where the start and end merges. FIG. 3B illustrates a pen tip 101 with a chamfer 160 while FIG. 3A illustrates the same pen tip 101 without the chamfer. The chamfer 160 may be created on the outside of the tip to reduce the wall thickness, which depends on the size of the orifice. For example, it is necessary that the wall should less than 12 μm thick, preferably less than 10 μm thick for a pen tip made of Alumina with an opening of 50 μm (internal diameter). There are many approaches to thinning the walls of the pen tip, but thinning the walls of the pen tip to allow much less surface area for the material to attach itself to during dispensing and during the lift off and separation.

Figure 4:
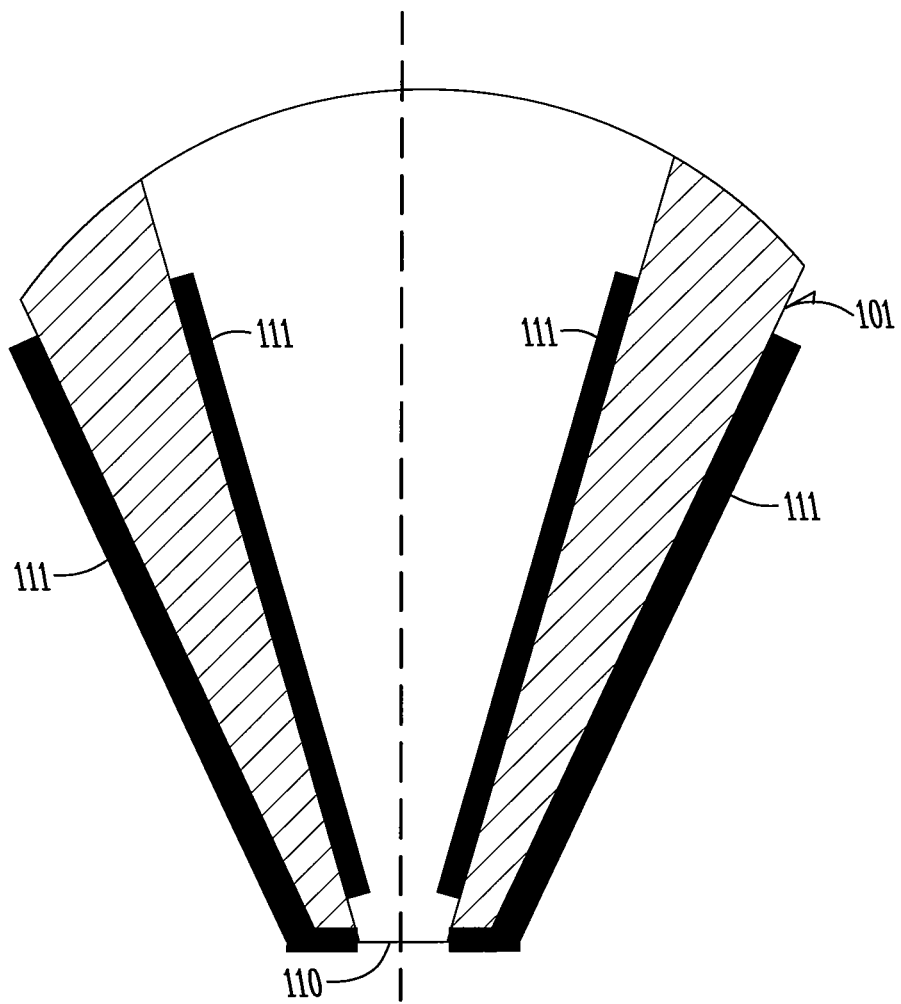
FIG. 4 is a schematic drawing of the pen tip with a hydrophobic coating.

Another modification of the needle which may be performed is to use Teflon tip or Teflon coated tip to reduce the tip/material interactions. Other low surface tension materials or treatment technologies could be used too. A pen tip that has been chamfered and then coated with Teflon will close the pen top hole for very small inner diameter openings. A laser with precise drilling can reshape this and open the hole to a specified opening. FIG. 4 illustrates the pen tip 101 with a coating 111 on the interior surfaces 111 of the orifice and the external surfaces of the pen tip 111.

Mechanical Vibrating Pen Tip

A number of mechanical vibrators exist and the invention is to cover all mechanical motions on the pen tip that will move the pen tip slightly thus causing a vibration that has effect on the material within or around the pen tip. Mechanically induced vibration or shockwaves within the pen tip can be performed with devices such as, but not limited to, piezoelectric. A number of methods can be used to attach the piezoelectric device to the pen tip. For example, one such configuration would be a ring transducer molded around the pen tip or dispensing nozzle. A second would be small flat squares that can be attached on a number of locations in and around the pen tip.

Figure 5A:
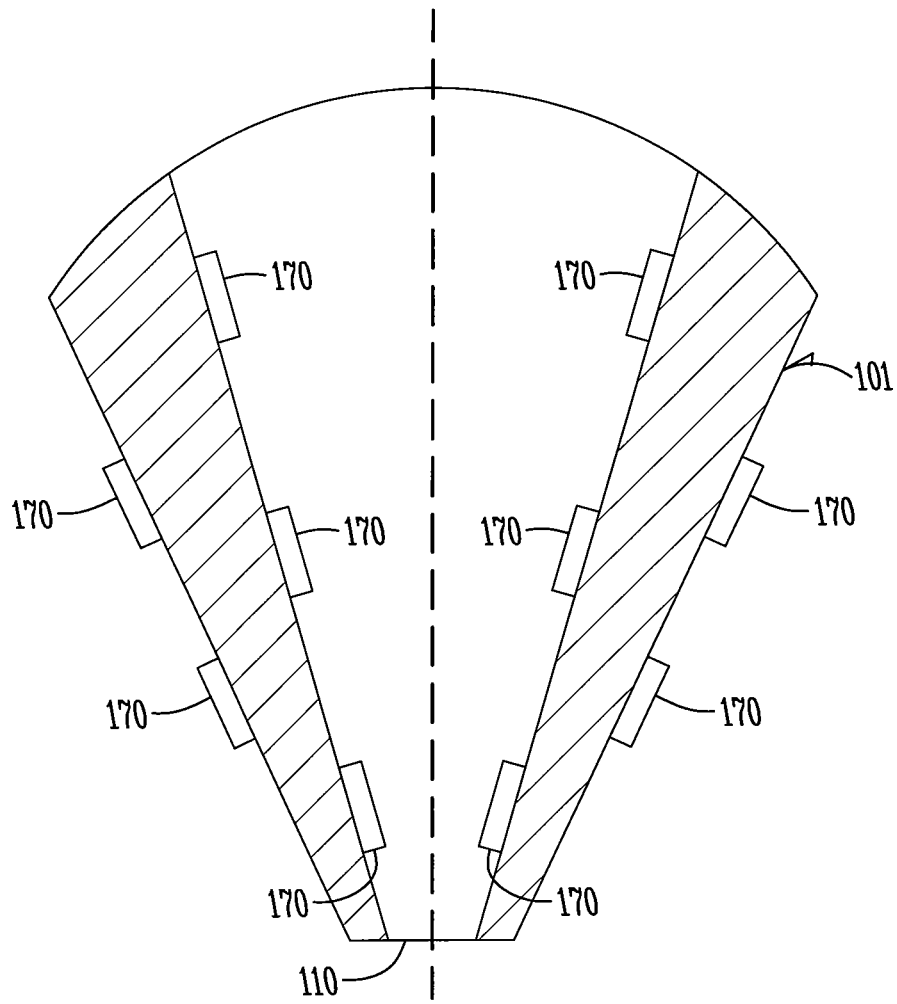
FIG. 5A and FIG. 5B are schematic drawing of the pen tip and mechanical vibrator(s).

FIG. 5A illustrates one embodiment for the use of mechanical vibrators. In FIG. 5A, mechanical vibrators 170 in the form of small flat squares are attached at various locations in and around the pen tip 101. This includes placement of such mechanical vibrators 170 on an external surface of the pen tip 101 and/or on an internal surface of the pen tip 101. Each of the mechanical vibrators 170 may be formed of a piezoelectric material or other type of material associated with a transducer for generating mechanical vibrations.

Figure 5B:
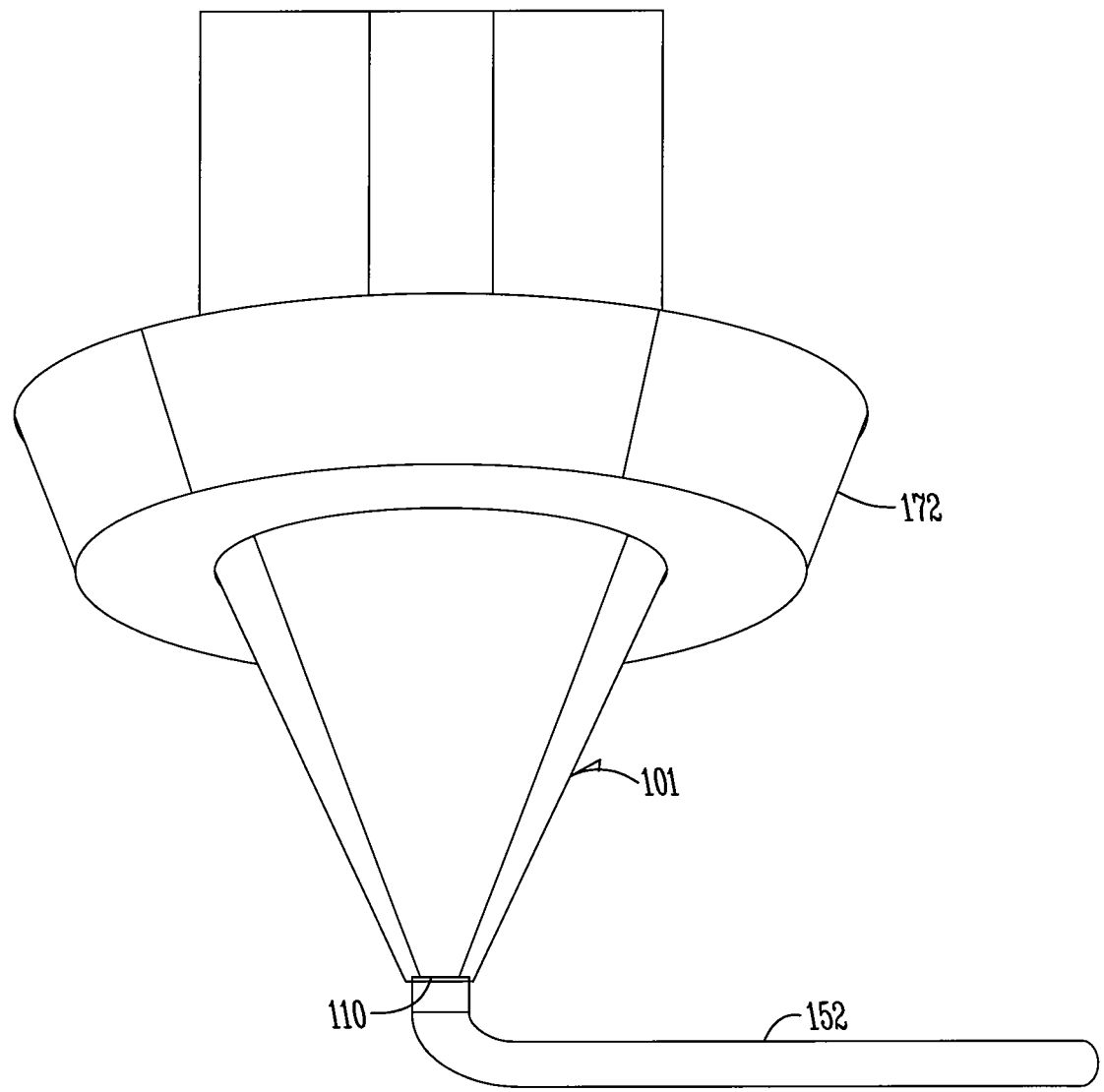

FIG. 5B illustrates another embodiment for the use of mechanical vibrators. In FIG. 5B, a mechanical vibrator 172 is in the form of a ring transducer molded around the pen tip. Alternatively, the ring transducer may be placed around the dispensing nozzle. The mechanical vibrator 172 assists in preventing the dispensed material from adhering to itself or the pen tip, especially when the dispensed material is a viscous material used to form a particular line 152 or pattern.

Multi-Nozzle Pump

A positive displacement pump will typically have a single nozzle with a single material feed point. Multiple nozzles, at least two, and up to more than ten may be placed on a single pump. The pump feed can be individual positive pressure for each nozzle, or a manifold with a single pressure to feed multiple nozzles simultaneously. The advanced multiple nozzle pump may have the same reverse valve seal point design as that described in U.S. Pat. No. 6,986,739. Each valve can be individually adjusted for refined adjustments on individual nozzles. The adjustments can be manual or automatic with computer control.

The multiple nozzles can be separate nozzles with a common access bar that moves the control valves up and down with a precise and synchronized motion. Each nozzle may have a separate pen tip, a separate valve body, a separate needle valve, separate seals or O-rings and separate feed port.

Figure 6:
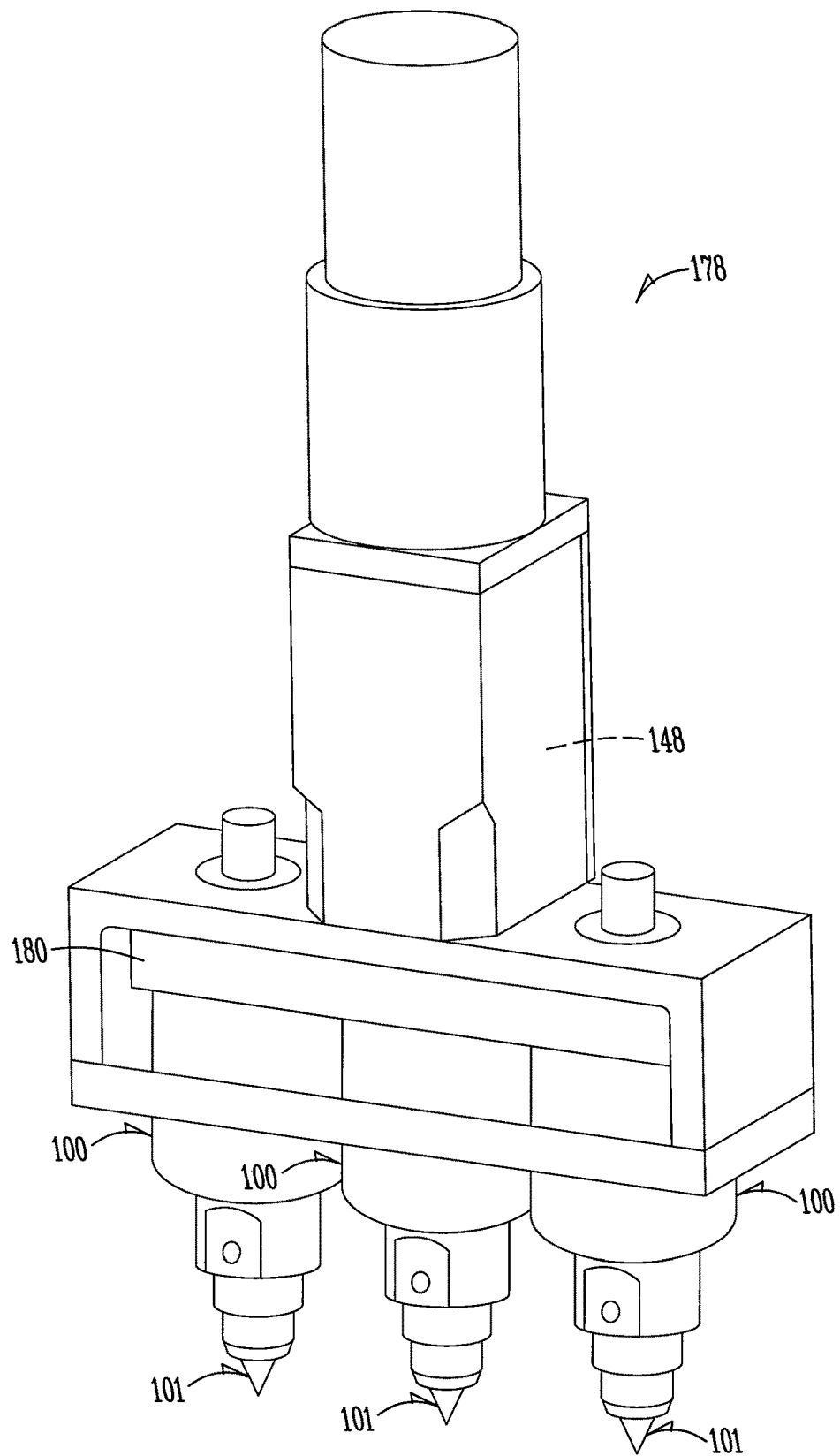
FIG. 6 is a schematic drawing of a multi nozzle embodiment.

FIG. 6 illustrates one such embodiment of an apparatus 178 which includes multiple nozzles, each with a separate pen tip 101. The nozzles share a single pump 148 and a common access bar 180. Of course, the present invention contemplates other variations in the specific components used to provide a multi-nozzle pump. For example a single molded valve body may be made to physically shrink the multi nozzle pump.

Conformal Mapping

Another aspect of the present invention relates to the use of conformal mapping. As previously explained, one of the benefits of the potential invention is the increased working distance. The substrate may be scanned such as by a laser, imaged by a camera, or otherwise analyzed to obtain a surface profile for applications with tight tolerance on the line height/width before dispensing. The needle tip and the laser spot, for example, may be calibrated in a three dimensional space prior to the scanning. By integrating the surface profile data to the motion software, the needle tip will follow the surface profile and a predetermined writing gap may be maintained when dispensing. With an increased gap the conformal mapping will be a much less accurate requirement, but allow for larger changes than the gap size. Thus, having the pen tip above the substrate is advantageous. As previously explained, with the pen tip at least 75 microns above the substrate and usually 150 to 300 microns above the substrate and sometimes up to 1000 microns above the substrate, it is not necessary to scan slightly conformal or bumpy surfaces and continuously adjust the z-axis position of the pen tip. Thus, the pen tip is sufficiently above the substrate that the dispensing process is not affected by minor surface variations in the substrate. Where the surface of the substrate exhibits large changes in surface heights, z-axis tracking may still be performed, however, the precision of the z-axis tracking need not be as precise as in systems where the dispensing tool is maintained more closely to the surface.

Thus, the gap may be set or predetermined by using optical or laser feedback on one or more points on the surface of the substrate. In cases where the surface is strongly conformal, it may be preferred to use a plurality of points exist greater than a particular height or distance. Alternatively, scanning can be performed. Thus, various types of analysis can be performed on the surface to assist in setting the gap.

Figure 7:
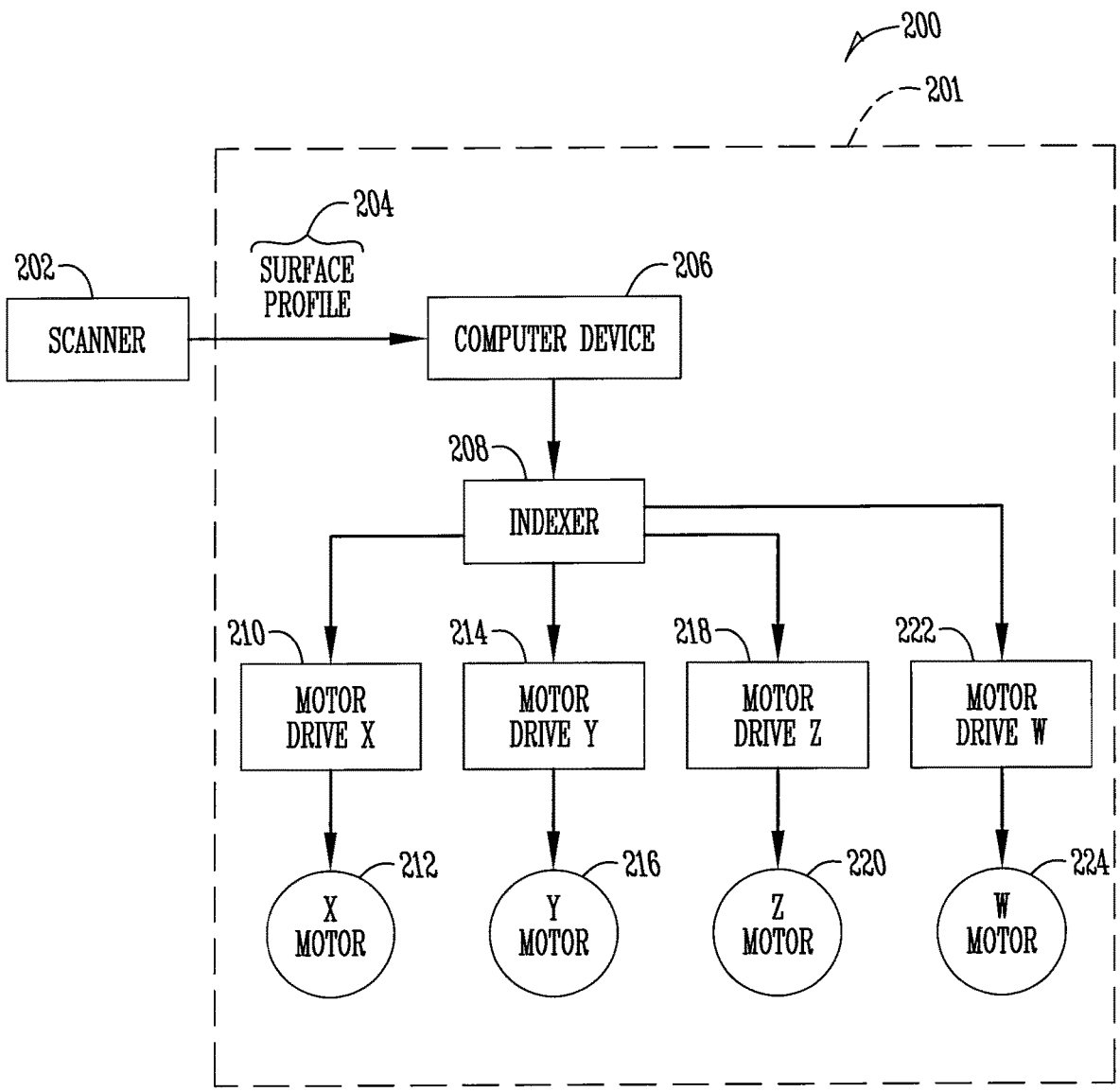
FIG. 7 is a block diagram illustrating use of a scanner to provide a surface profile and use of a location control device.

FIG. 7 illustrates a subsystem 200 of one embodiment of a material dispenser. The subsystem 200 includes a location control device 201 which is in operative communication with a scanner such as a scanner 202 which may be a laser or other device for scanning a substrate or other surface and generating a surface profile 204. The location control device 201 includes a computing device 206 which is operatively connected to an indexer 208. The indexer 208 is operatively connected to a motor drive X 210 which is operatively connected to an X motor 212. The indexer 208 is operatively connected to a motor drive Y 214 which is operatively connected to an Y motor 216. The indexer 208 is operatively connected to a motor drive Z 218 which is operatively connected to a Z motor 220. The indexer 208 is operatively connected to a motor drive W 222 which is operatively connected to a W motor 224. The location control device 201 is adapted to position the tool, specifically the tip orifice, at any selected position with respect to the substrate or target area. The location control device can be aided by data collected by scanning the substrate or surface area to obtain a surface profile. The surface profile may assist in maintaining a predetermined writing gap while dispensing.

Thus various embodiments of an apparatus for dispensing and methods of dispensing have been described. The present invention is not to be limited to the specific disclosure herein as numerous variations, alternatives, and options may be applied which fall within the spirit and scope of the invention.

What is claimed is:

1. A method for depositing a material on a substrate in a continuous line pattern, the method comprising steps of:

providing an apparatus with at least one material dispenser comprising: (i) a tip orifice defining an opening within a pen tip through which the material exits the dispenser, (ii) at least one elongate feed channel having an inlet and a spaced outlet adjacent the tip orifice, the at least one feed channel having material therein and being sized and shaped so that the material therein may flow through the at least one channel from the inlet to the outlet, (iii) a valve at the outlet for controlling the flow of material through the outlet of the at least one feed channel, the valve being moveable between an open position, in which materials is permitted to flow through the outlet, and a closed position, in which material is not permitted to flow through the outlet, the valve having a valve tip sized and shaped to seal the tip orifice against the flow of the material, (iv) an actuator operatively coupled to the valve for selectively moving the valve between the open position and the closed position, and (v) and a location control device adapted to position the pen tip at any selected writing gap position with respect to the substrate, the location control device having a plurality of motors arranged to control positioning of the tip orifice relative to the substrate in three dimensions including an X motor for movement along an x-axis, a Y motor for movement along a y-axis, and a Z motor for movement along a z-axis;

prior to dispensing the material, determining by the apparatus a writing gap above the substrate to provide a predetermined writing gap setting, the writing gap having a distance of more than 75 micrometers above the substrate, the distance being greater than a line height for the continuous line pattern being dispensed such that the pen tip is positioned such that it is spaced apart from and above the continuous line pattern while avoiding spreading out or whipping around of the material during dispensing;

positioning the pen tip to below 75 micrometers above the substrate and dispensing the material from the pen tip to wet a start of the continuous line pattern on the substrate without contacting the substrate;

positioning the pen tip above the substrate and above the line height for the continuous line pattern using the location control device according to the predetermined writing gap setting and not based on contact force feedback between the pen tip and the substrate and wherein optical or laser feedback is used on one or more points on a surface of the substrate to position the pen tip at the predetermined writing gap setting;

dispensing the material onto the substrate to form the continuous line pattern defined by the surface of the substrate, the line height of the continuous line pattern, and the line width while controlling, by the apparatus, velocity of the flow of material through the outlet and dispense speed to control dispensed line height and the dispensed line width parameters based on the predetermined writing gap setting wherein the larger the predetermined writing gap, the higher the velocity of the flow of the material through the outlet without contacting the continuous line pattern and substrate;

during the dispensing of the continuous line pattern adjusting position of the pen tip using the location device to simultaneously move along the x-axis, the y-axis, and the z-axis using the X motor, Y motor, and Z motor;

wherein the pen tip orifice has a rectangular shape or an oval shape; and rotating the pen tip orifice 90 degrees during dispensing to change the line width of the continuous line pattern;

wherein the line width for the continuous line pattern is 300 micrometers or less.

2. The method of claim 1 wherein the distance being less than 1000 micrometers above the substrate.

3. The method of claim 1 wherein the pen tip has a chamfer on an outside surface of the pen tip.

4. The method of claim 3 wherein the pen tip has a wall thickness of less than 12 micrometers.

5. The method of claim 4 wherein the pen tip comprises a hydrophobic coating thereon.

6. The method of claim 1 wherein at least one mechanical vibrator is operatively connected with the pen tip to induce mechanical vibrations of the pen tip.

7. The method of claim 1 wherein the apparatus comprises a plurality of material dispensers sharing a single pump.

8. The method of claim 1 further comprising scanning the substrate to obtain a surface profile before dispensing.

9. The method of claim 8 further comprising using the surface profile to maintain the predetermined writing gap while dispensing.

10. The method of claim 9 wherein the scanning is performed using a laser or a camera.

11. The method of claim 1 wherein the material is displaced forward as the valve moves to the open position and the material is sucked back as the valve is moved to the closed position.

12. The method of claim 1 wherein the continuous line pattern is within a pattern comprising lines and dots.

13. A method for depositing a material on a substrate in a continuous line pattern, the method comprising steps of:

providing an apparatus with at least one material dispenser comprising: (i) a tip orifice defining an opening within a pen tip through which the material exits the dispenser, (ii) at least one elongate feed channel having an inlet and a spaced outlet adjacent the tip orifice, the at least one feed channel having material therein and being sized and shaped so that the material therein may flow through the at least one channel from the inlet to the outlet, (iii) a valve at the outlet for controlling the flow of material through the outlet of the at least one feed channel, the valve being moveable between an open position, in which materials is permitted to flow through the outlet, and a closed position, in which material is not permitted to flow through the outlet, the valve having a valve tip sized and shaped to seal the tip orifice against the flow of the material, (iv) an actuator operatively coupled to the valve for selectively moving the valve between the open position and the closed position, (v) and a location control device adapted to position the pen tip at any selected writing gap position with respect to the substrate;

prior to dispensing the material determining by the apparatus a writing gap above the substrate to provide a predetermined writing gap setting for writing the continuous line pattern on the substrate, the writing gap having a distance of more than 75 micrometers above the substrate, the distance being greater than a line height for the continuous line pattern such that the pen tip is positioned such that it is spaced apart from and above the continuous line pattern and the distance of the writing gap being further based on dispensed line width parameters and to prevent spreading out or whipping around of the material during dispensing, wherein a height of the predetermined writing gap is not affected by variations on a surface of the substrate;

positioning the pen tip to below 75 micrometers above the substrate prior to dispensing the material to form the continuous line pattern and dispensing the material from the pen tip to wet a start on the substrate without contacting the substrate;

positioning the pen tip above the substrate after dispensing the material to wet a start of the substrate to start dispensing the continuous line pattern using the location control device according to the predetermined writing gap setting and not based on contact force feedback between the pen tip and the substrate, the predetermined writing gap setting having a distance of more than 75 micrometers above the substrate, the distance being greater than the line height for the continuous line pattern and the substrate such that the pen tip is positioned above and spaced apart from the continuous line pattern, and wherein optical or laser feedback is used on one or more points on a surface of the substrate to position the pen tip at the predetermined writing gap setting; and dispensing the material onto the substrate while controlling velocity of the flow of material through the outlet and dispense speed to control dispensed line height and dispensed line with parameters based on the predetermined writing gap setting wherein the larger the predetermined writing gap setting, the higher the velocity of the flow of the material through the outlet, and wherein the dispensing occurs while also controlling position of the pen tip along an x-axis, y-axis, and z-axis using a plurality of motors by the location device; wherein the pen tip orifice has a rectangular shape or an oval shape; and rotating the pen tip orifice 90 degrees during dispensing to change the line width of the continuous line pattern; wherein the predetermined writing gap setting is maintained during the dispensing of the material onto the substrate to form the continuous line pattern.

14. The method of claim 13 further comprising scanning the substrate to obtain a surface profile before dispensing.

15. The method of claim 14 further comprising using the surface profile to maintain the predetermined writing gap while dispensing.

\* \* \* \* \*